(12) United States Patent
Guo

(10) Patent No.: US 11,271,034 B2
(45) Date of Patent: Mar. 8, 2022

(54) METHOD OF MANUFACTURING MAGNETIC MEMORY DEVICES

(71) Applicant: Yimin Guo, San Jose, CA (US)

(72) Inventor: Yimin Guo, San Jose, CA (US)

(*) Notice: Subject to any disclaimer, the term of this patent is extended or adjusted under 35 U.S.C. 154(b) by 0 days.

(21) Appl. No.: 14/269,066

(22) Filed: May 2, 2014

(65) Prior Publication Data
US 2014/0328116 A1 Nov. 6, 2014

Related U.S. Application Data

(60) Provisional application No. 61/820,101, filed on May 6, 2013.

(51) Int. Cl.
| | | |
|---|---|---|
| *G11C 11/16* | (2006.01) | |
| *H01L 27/22* | (2006.01) | |
| *H01L 43/12* | (2006.01) | |
| *H01L 43/08* | (2006.01) | |
| *H01L 43/02* | (2006.01) | |
| *H01L 43/10* | (2006.01) | |

(52) U.S. Cl.
CPC .......... *H01L 27/222* (2013.01); *G11C 11/161* (2013.01); *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/228; H01L 43/08; H01L 43/12; G11C 11/161
USPC ...................................................... 438/48, 49
See application file for complete search history.

(56) References Cited

U.S. PATENT DOCUMENTS

| | | | |
|---|---|---|---|
| 2004/0180531 A1* | 9/2004 | Horikoshi ............... | G11C 11/16 438/622 |
| 2006/0027486 A1* | 2/2006 | Rosenbaum ........... | C10G 45/44 208/180 |
| 2012/0217476 A1* | 8/2012 | Ikeno .................... | G11C 11/161 257/16 |

* cited by examiner

*Primary Examiner* — Long K Tran

(57) ABSTRACT

A method of manufacturing a plurality of magnetoresistive memory element having a dielectric thermal buffer layer between a thin top electrode of the magnetic tunnel junction (MTJ) element and a bit line, and a bit-line VIA electrically connecting the top electrode and the bit line having a vertical distance away from the location of the MTJ stack. In a laser thermal annealing, a short wavelength of a laser has a shallow thermal penetration depth and a high thermal resistance from the bit line to the MTJ stack only causes a temperature rise of the MTJ stack being much smaller than that of the bit line. As the temperature of the MTJ element during the laser thermal annealing of bit line copper layer is controlled under 300-degree C., possible damages on MTJ and magnetic property can be avoided.

1 Claim, 2 Drawing Sheets

METHOD OF MANUFACTURING MAGNETIC MEMORY DEVICES

RELATED APPLICATIONS

This application claims the priority benefit of U.S. Provisional Application No. 61,820,101 filed on May 6, 2013, which is incorporated herein by reference.

BACKGROUND OF THE INVENTION

1. Field of the Invention

This invention relates generally to a spin-transfer-torque magnetic-random-access memory (MRAM) cell having a heat buffer (barrier) layer for reducing undesirable heating of the magnetic tunneling junction during pulsed laser heating annealing of upper copper bit lines.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

There has been a known technique for achieving a high MR ratio by forming a crystallization acceleration film that accelerates crystallization and is in contact with an interfacial magnetic film having an amorphous structure. As the crystallization acceleration film is formed through a thermal annealing process or a rapid thermal annealing process, crystallization is accelerated from the tunnel barrier layer side, and the interfaces with the tunnel barrier layer and the interfacial magnetic film are matched to each other. Typically, the annealing temperature is preferred to be between 250-degree C. and 350-degree C. By using this technique, a high MR ratio can be achieved.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller. In a so-called perpendicular STT-MRAM, both two magnetization films in an MTJ stack have easy axis of magnetization in a direction perpendicular to the film plane due to their strong magnetic crystalline anisotropy and interface interaction induced anisotropy, shape anisotropies are not used, and accordingly, the device shape can be made smaller than that of an in-plane magnetization type. Also, variance in the easy axis of magnetization can be made smaller. Accordingly, both miniaturization and lower currents can be expected to be achieved while a thermal disturbance resistance is maintained. In another word, perpendicular STT-MRAM having high speed, large capacities and low-power-consumption operations can potentially replace the conventional semiconductor memory used in electronic chips, especially mobile chips for power saving and non-volatility.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

The thermal stability of the magnetic orientation in a MRAM cell is a critical parameter which has to be kept high enough for a good data retention, and is typically characterized by the so-called thermal factor which is proportional to the perpendicular anisotropy as well as the volume of the recording layer cell size.

Combining writing, reading and thermal stability factors, an MRAM has to be well designed and manufactured with tight processing variations. However, there are still thermal incompatibilities between magnetic and semiconductor materials. The bottom CMOS material annealing can be conducted before MTJ deposition, but the upper bit line which is preferred to made of copper or CuAl is fabricated after MTJ deposition and typically requires a high temperature (400-degree C. or higher) annealing to achieve enlargement of grain size, remove tension from the material and reduce electromigration. This high temperature annealing process would degrade MTJ magnetic properties.

A pulsed laser thermal annealing has much faster heating and cooling rates and shallow thermal penetration depth which should reduce direct heating to the lower magnetic materials. Since a bit line still needs a much higher annealing temperature well above 400-degree C., a direct metal thermal conduction between the bit line and the MTJ would lead a higher temperature of the MTJ element above its thermal margin, yielding a damage of tunneling barrier or magnetic materials.

Thus, it is desirable to provide STT-MRAM structures having a heat barrier for reducing undesirable heating of the magnetic tunneling junction during pulsed laser heating annealing of upper copper bit lines.

BRIEF SUMMARY OF THE PRESENT INVENTION

The present invention comprises a magnetoresistive memory cell having a heat barrier for reducing undesirable heating of the magnetic tunneling junction during pulsed laser heating annealing of upper copper bit lines.

An exemplary embodiment includes a spin-transfer-torque magnetoresistive memory cell consisting of a bottom electrode connecting to a VIA of a select transistor, an MTJ stack, a top electrode, a bit line, an insulating thermal barrier layer between the top electrode and the bit line, a connection VIA connecting the top electrode and the bit line.

The bit line is typically made of a copper or CuAl line having a seed layer such as TiN, TaN, etc. and is encapsulated by a SiNx layer. The growth of an electro-plated copper layer is polycrystalline. The size of the grains depends on the substrate surface, the growth conditions as well as on the size of the graves and vias. Electroplated Cu films demonstrate an intriguing phenomenon known as "self-annealing"; the as-plated films are not stable and their microstructure evolves even at room temperature. However re-crystallization is not under control and not uniform in this case and depends also on the width of the Cu lines. And more, large different thermal expansion coefficients of dielectric and copper can promote detachments between copper and dielectric material. A narrow bit line electromigration is another major concern for integrated circuitry whereby the moving electrons that constitute electrical current collide with stationary atoms of the interconnect and push these atoms in the direction of the electron flow. In order to improve the properties of the copper layer, a Cu thermal anneal is required. Microstructural, mechanical and contamination results show that rapid thermal anneals at 400° C. offer performances that are similar to longer furnace anneals at the same temperature, whereas 250° C. anneals are insufficient and 300° C. anneals are marginal. A typical MTJ would be damaged or partially damaged by a conventional uniform high temperature annealing of copper lines by long batch furnace thermal treatments.

In a laser thermal annealing, a short wavelength of a laser has a shallow thermal penetration depth which reduces direct heating to the lower magnetic materials. In this invention, a dielectric thermal buffer or barrier layer having a low thermal conductivity is deposited between a thin top electrode of the MTJ element and a bit line, while the VIA electrically connecting the top electrode and the bit line has a vertical distance away from the location of the MTJ element. Thus, a high thermal resistance from the bit line to the MTJ element is achieved, and the temperature rise of the MTJ element is much smaller than that of the bit line during a pulsed laser thermal annealing. As the temperature of the MTJ element during the laser thermal annealing of bit line copper layer is controlled under 300-degree C., there is no damage on MTJ and magnetic property.

Various embodiments will be described hereinafter with reference to the companying drawings. The drawings are schematic or conceptual, and the relationships between the thickness and width of portions, the proportional coefficients of sizes among portions, etc., are not necessarily the same as the actual values thereof.

DETAILED DESCRIPTION OF THE INVENTION

In general, according to each embodiment, there is provided a magnetoresistive memory cell comprising:

a bottom electrode provided on a surface of a substrate connecting to a VIA of a select transistor;
a patterned MTJ stack consisting of a seed layer provided on the top surface of the bottom electrode, an MTJ multilayer provided on the top surface of the seed layer and a cap layer provided on the top surface of the MTJ multilayer;
a top electrode provided on the surface of the MTJ stack;
a dielectric thermal barrier layer provided on the top surface of the top electrode;
a bit-line VIA provided on the surface of the top electrode and surrounded by the dielectric thermal barrier layer and having a vertical distance away from the MTJ stack;
a bit line provided on the top surface of the dielectric thermal barrier layer and electrically connecting to the bit-line VIA.

An exemplary embodiment includes a spin-transfer-torque magnetoresistive memory cell including a bottom electrode connecting to a VIA of a select transistor, a patterned MTJ stack vertically overlaid on top of the VIA of the select transistor and consisting of a seed layer, an MTJ multilayer and a cap layer, a top electrode on the top surface of the MTJ stack having a thin multilayer, an insulating thermal barrier layer deposited on the top electrode, a bit line deposited on the insulating thermal barrier layer and a bit-line VIA having vertical distance away from the MTJ stack and connecting the bit line and the top electrode.

Another exemplary embodiment includes a spin-transfer-torque magnetoresistive memory cell including a bottom electrode connecting to a VIA of a select transistor, a patterned MTJ stack having a vertical distance away from the VIA of the select transistor and consisting of a seed layer, an MTJ multilayer and a cap layer, a top electrode on the top surface of the MTJ stack having a thin multilayer, an insulating thermal barrier layer deposited on the top electrode, a bit line deposited on the insulating thermal barrier layer and a bit-line VIA having vertical distance away from the MTJ stack and connecting the bit line and the top electrode.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

Figure 1:
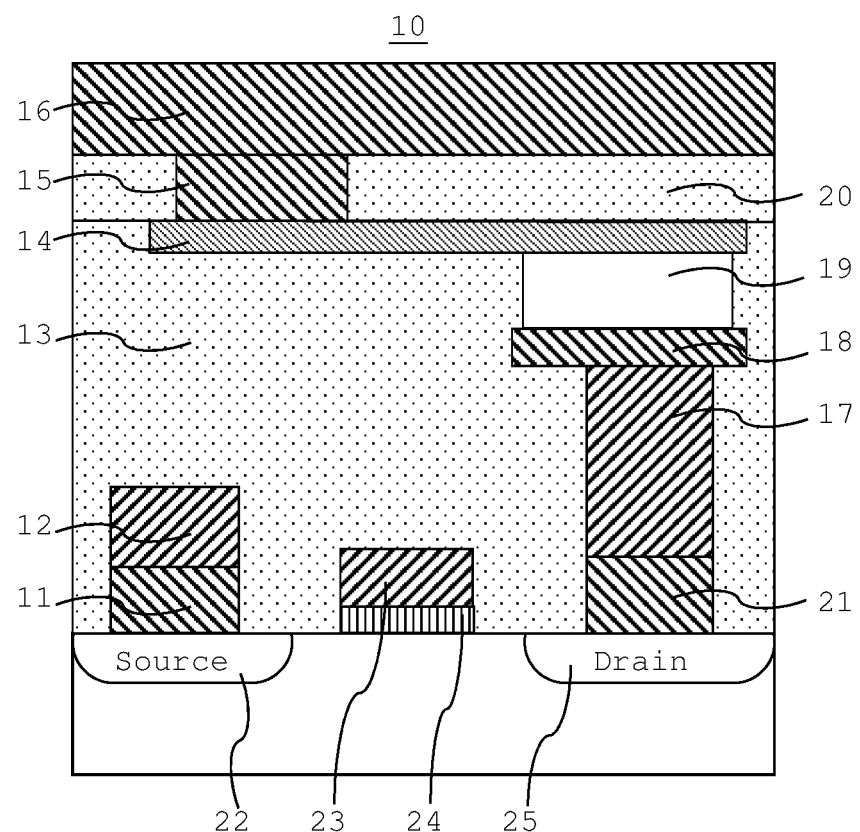
FIG. 1 is a cross-section of one memory cell in a STT-MRAM array having an insulating thermal barrier vertically separating an MTJ element and a bit line in the first embodiment.

FIG. 1 is a cross sectional view of a magnetoresistive memory cell in a perpendicular STT-MRAM array. The magnetoresistive memory cell 10 is configured by a bit line 16, a bit-line-VIA15, a top electrode 14, an insulating dielectric thermal barrier layer 20, an MTJ stack 19 including a seed layer, a magnetic multilayer and a cap layer sequentially stacking from bottom up (not shown explicitly in this figure), a bottom electrode 18, a VIA of a select transistor 17, a ILD layer 13, and a select transistor comprising an interconnect layer 12, a source contact 11, drain contract 21, source region 22, a gate insulating film 23, a gate electrode 24 and a drain region 25.

The bit line 16 typically made of a copper or CuAl line having a seed layer such as TiN, TaN, etc. and is encapsulated by a SiNx layer. In a laser thermal annealing, a short wavelength of a laser has a shallow thermal penetration depth which should reduce direct heating to the lower magnetic materials. And further, a dielectric thermal barrier layer 20 having a low thermal conductivity is deposited between a thin top electrode 14 of the MTJ element and a bit line 16, while a bit-line VIA electrically connecting the top electrode 14 and the bit line 16 has a vertical distance away from the location of the MTJ stack 19. The top electrode 14 is typically made of a thin multilayer Ta/Ru/Ta. Thus, a high thermal resistance from the bit line 16 to the MTJ stack 19 is achieved, and a low thermal resistance from the MTJ stack to the VIA of the select transistor. During a pulsed laser thermal annealing on the bit line, the temperature rise of the MTJ element is much smaller than that of the bit line. As the temperature of the MTJ element during the laser thermal annealing of bit line copper layer is readily controlled under 300-degree C. while the thermal annealing temperature of the bit line reaches more than 400-degree C., there is no damage on MTJ and magnetic property.

The insulating thermal barrier layer 20 is preferred to be made of an oxide, or nitride, or oxynitride selected from the stoichiometric composition group of $Al_2O_3$, $SiO_2$, $Si_3N_4$, MgO, which is made from a balanced chemical reaction.

Figure 2:
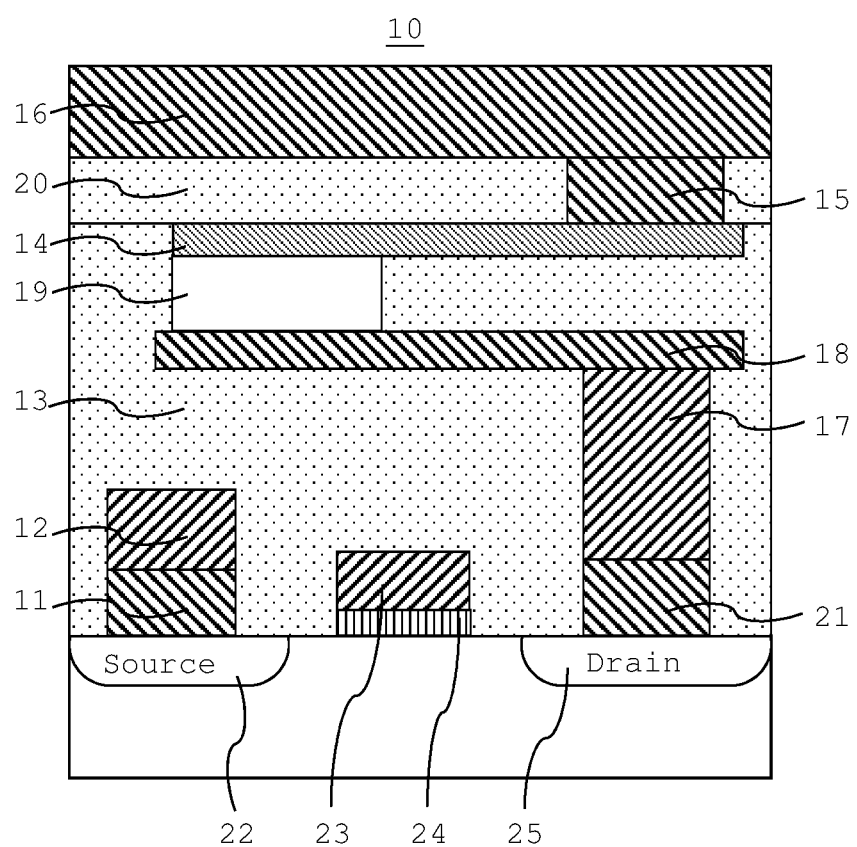
FIG. 2 is a cross-section of one memory cell in a STT-MRAM array having an insulating thermal barrier vertically separating an MTJ element and a bit line in the second embodiment.

FIG. 2 is a cross-sectional view of a magnetoresistive memory cell in a perpendicular STT-MRAM array in another embodiment. The magnetoresistive memory cell 10 is configured by a bit line 16, a bit-line VIA 15, a top electrode 14, an insulating dielectric thermal barrier layer 20, an MTJ stack 19 including a seed layer, a magnetic multilayer and a cap layer sequentially stacking from bottom up (not shown explicitly in this figure), a bottom electrode 18, a VIA of a select transistor 17, a ILD layer 13, and a select transistor comprising an interconnect layer 12, a source contact 11, drain contact 21, source region 22, a gate insulating film 23, a gate electrode 24 and a drain region 25.

The bit line 16 typically made of a copper or CuAl line having a seed layer such as TiN, TaN, etc. and is encapsulated by a SiNx layer. In a laser thermal annealing, a short wavelength of a laser has a shallow thermal penetration depth which should reduce direct heating to the lower magnetic materials. And further, a dielectric thermal barrier layer 20 having a low thermal conductivity is deposited between a thin bottom electrode 18 of the MTJ element and a bit line 16, while a bit-line VIA 15 electrically connecting the top electrode 14 and the bit line 16 has a vertical distance away from the location of the MTJ stack 19. The top electrode 14 is typically made of a thin multilayer Ta/Ru/Ta. Thus, a high thermal resistance from the bit line 16 to the MTJ stack 19 is achieved. During a pulsed laser thermal annealing on the bit line, the temperature rise of the MTJ element is much smaller than that of the bit line. As the temperature of the MTJ element during the laser thermal annealing of bit line copper layer is readily controlled under 300-degree C. while the thermal annealing temperature of the bit line reaches more than 400-degree C., there is no damage on MTJ and magnetic property.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of manufacturing a magnetoresistive memory element comprising:
   deposit and pattern a bottom electrode on a surface of an dielectric substrate connecting to a VIA of a select transistor;
   deposit and pattern a magnetic tunnel junction (MTJ) stack;
   refill a dielectric layer surrounding the MTJ stack and conduct a chemical mechanical polishing (CMP) process to flatten the top surface;
   deposit and pattern a top electrode on the surface of the MTJ stack and surrounding dielectric layer;
   deposit a dielectric thermal barrier layer on the top surface of the top electrode;
   open a bit-line VIA in the dielectric thermal barrier layer on the surface of the top electrode and having a vertical distance away from the MTJ stack;
   deposit a seed layer and electroplate a bit line in the bit-line VIA and on the top surface of the dielectric thermal barrier layer;
   conduct a CMP process to flatten the top surface of the bit line and followed by a deposition of a dielectric protective layer;
   conduct a pulsed short wavelength laser thermal annealing on the bit line;
   wherein said laser thermal annealing generates a temperature rise of said bit line above 400-degree C.; and
   wherein during said laser thermal annealing, the maximum temperature rise of said MTJ stack is below 300-degree C.

* * * * *